United States Patent
Glass et al.

(10) Patent No.: US 7,814,284 B1
(45) Date of Patent: Oct. 12, 2010

(54) REDUNDANCY ELIMINATION BY AGGREGATION OF MULTIPLE CHUNKS

(75) Inventors: Gideon Glass, Toronto (CA); Maxim Martynov, Los Gatos, CA (US); Qiwen Zhang, San Jose, CA (US); Etai Lev Ran, Sunnyvale, CA (US); Dan Li, Sunnyvale, CA (US)

(73) Assignee: Cisco Technology, Inc., San Jose, CA (US)

( * ) Notice: Subject to any disclaimer, the term of this patent is extended or adjusted under 35 U.S.C. 154(b) by 898 days.

(21) Appl. No.: 11/624,352

(22) Filed: Jan. 18, 2007

(51) Int. Cl.
*G06F 12/00* (2006.01)

(52) U.S. Cl. .................. 711/154; 711/158; 704/278; 704/258; 704/504; 704/269

(58) Field of Classification Search .............. 711/154, 711/158; 704/278, 258, 504, 269; 707/201
See application file for complete search history.

(56) References Cited

U.S. PATENT DOCUMENTS

| 4,464,650 A | 8/1984 | Eastman et al. |
| 4,558,302 A | 12/1985 | Welch |
| 6,266,643 B1 * | 7/2001 | Canfield et al. ............. 704/278 |
| 2006/0123250 A1 * | 6/2006 | Maheshwari et al. ........ 713/193 |
| 2006/0282475 A1 * | 12/2006 | Suermondt et al. .......... 707/201 |

* cited by examiner

*Primary Examiner*—Sanjiv Shah
*Assistant Examiner*—Midys Rojas
(74) *Attorney, Agent, or Firm*—Baker Botts L.L.P.

(57) ABSTRACT

A data redundancy elimination system. In particular implementations, a method includes storing in a memory one or more aggregation trees, each aggregation tree comprising one or more base chunk nodes and one or more super chunk nodes, wherein each base chunk node comprises a chunk signature and corresponding raw data, and wherein super chunk nodes correspond to child base chunk nodes and include a chunk signature; receiving a data block; dividing the data block into a plurality of base chunks, each base chunk having a degree value characterizing the occurrence probability of the base chunk; computing chunk signatures for the plurality of base chunks; applying a super chunk rule to contiguous sequences of base chunks of the plurality of base chunks to create one or more aggregation trees, wherein the super chunk rule aggregates base chunks based on the respective occurrence probabilities of the base chunks; identifying one or more nodes in the one or more created aggregation trees that match corresponding nodes of the aggregation trees in the memory; compressing the received data block based on the identified nodes; and conditionally adding the one or more created aggregation trees to the memory.

20 Claims, 6 Drawing Sheets

REDUNDANCY ELIMINATION BY AGGREGATION OF MULTIPLE CHUNKS

FIELD OF THE INVENTION

This disclosure relates generally to data compression systems.

BACKGROUND OF THE INVENTION

To improve data transmission over a network, data is often compressed using data redundancy elimination (DRE) schemes. DRE schemes typically divide data blocks into chunks and replace redundant chunks with short identifiers, typically referred to as chunk signatures. Compression is achieved by sending signatures instead of raw data over the network. Two existing approaches for dividing data blocks are fixed-size division and pseudo-random division. Fixed-size division divides data blocks into pre-defined, fixed-sized chunks. Pseudo-random division selects chunk breakpoints based on the values of the bytes in the data block. Both of these approaches are typically characterized, by the expected chunk size. In any approach to chunking, the maximum compression ratio that can be achieved is estimated as a ratio of chunk signature size to the (expected) chunk length. Longer chunks typically provide better compression, since more raw data can be replaced with a smaller signature. However, longer chunks are less suitable for detecting small-sized redundancies within a data stream, because the size of detectable redundant pattern typically needs to be greater than the expected chunk size. Accordingly, in practice, increasing chunk size often results in poor compression ratios.

DESCRIPTION OF EXEMPLARY EMBODIMENTS

A. Overview

Particular embodiments perform data redundancy elimination (DRE) in a manner that increases compression ratios of redundant data transfers while keeping chunk sizes small. According to one implementation, after a compression module receives a data block to be transmitted, a chunking algorithm breaks the data block into base chunks. In one implementation, the compression module applies a super chunk rule to aggregate the base chunks into one or more super chunks. In one implementation, the super chunk rule is operative to aggregate the base chunks into one or more super chunks based on a probabilistic frequency that a given chunk may occur in random data of a data stream. The compression module may then generate chunk signatures for each base chunk and super chunks. In one implementation, the compression module arranges the super chunks and base chunks in a hierarchical aggregation tree to facilitate fast look up operations. Because the chunk signature, may represent various combinations of base chunks and super chunks, larger amounts of raw data may be potentially substituted with a single chunk signature, thereby improving the compression ratio and increasing throughput. Chunk signatures can be checksums or other hashed values.

B. Example Network System Architecture

B.1. Network Topology

Figure 1:
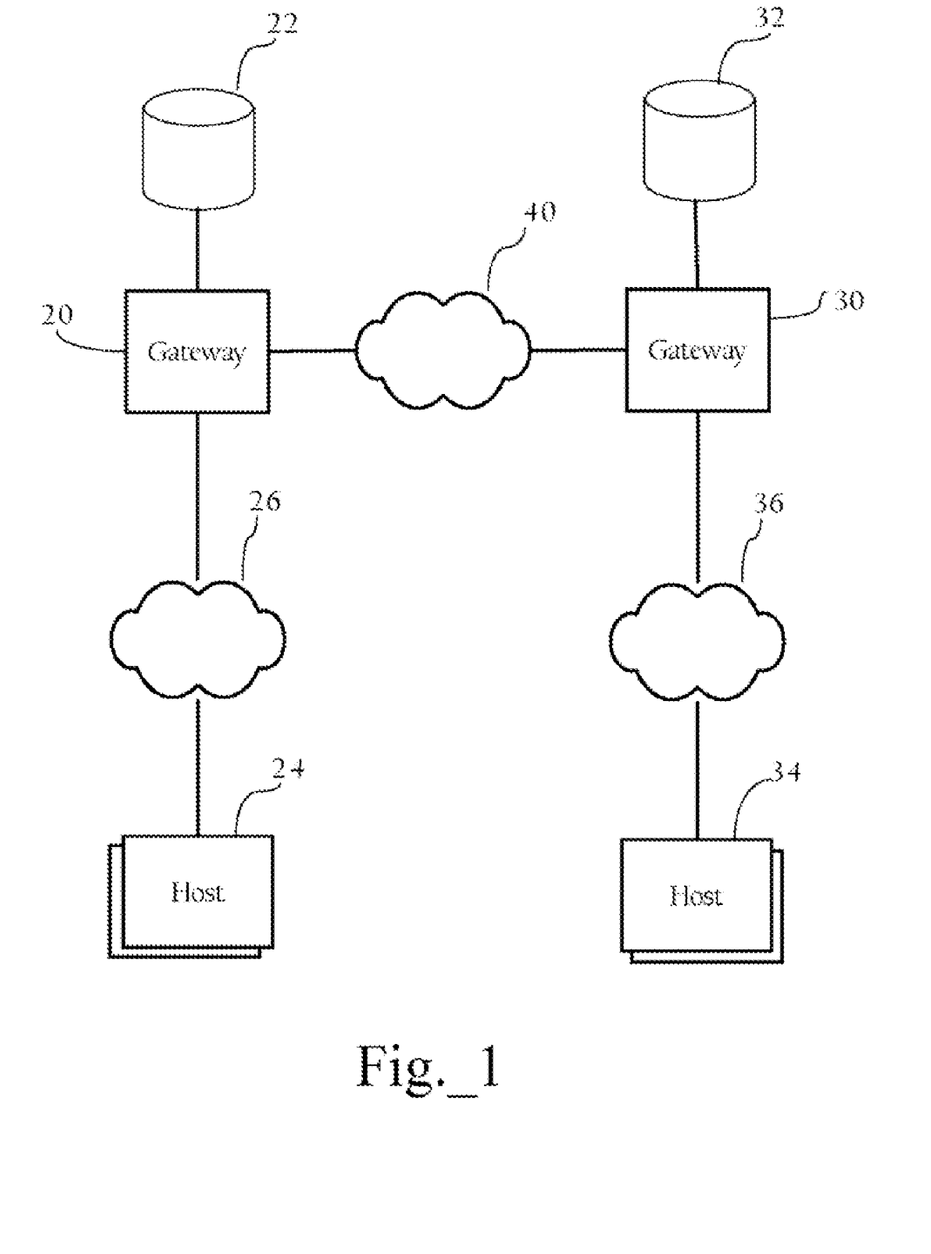
FIG. 1 illustrates example components in a data transmission system.

FIG. 1 illustrates example components in a data compression system. In a specific embodiment, the system includes a gateway 20 coupled to a cache 22, and one or more hosts 24 via a network 26. The system also includes another gateway 30 coupled to a cache 32 and a host 34 via a network 36. The gateways 20 and 30 are coupled by a network 40, and are disposed in the communications path between a plurality of hosts (e.g., hosts 24, 34). Hosts 24, 34 may be server systems, client systems or intermediate nodes. As described in more detail below, the gateways 20 and 30, in one implementation, include a compression module operative to perform compression and decompression functionalities when transmitting and receiving data over the network 40. The compression and decompression functionalities of the compression module may be located at any appropriate location such as an end host 24 and 34, or at an intermediate device such as gateways 20 and 30. Furthermore, the gateways 20 and 30 may employ some form of encapsulation (such as General Routing Encapsulation (GRE), etc.) to tunnel compressed data streams to each other.

In one implementation, each of networks 26, 36, and 40, generally refer to a computer network, such as a LAN, a WAN, etc., that may include one or more intermediate network devices (e.g. routers, switches, etc.), which allow for the transmission of data and/or messages. FIG. 1 illustrates one possible data transmission environment in which the embodiments may operate; however, other implementations are possible.

B.2. Gateway

Figure 2:
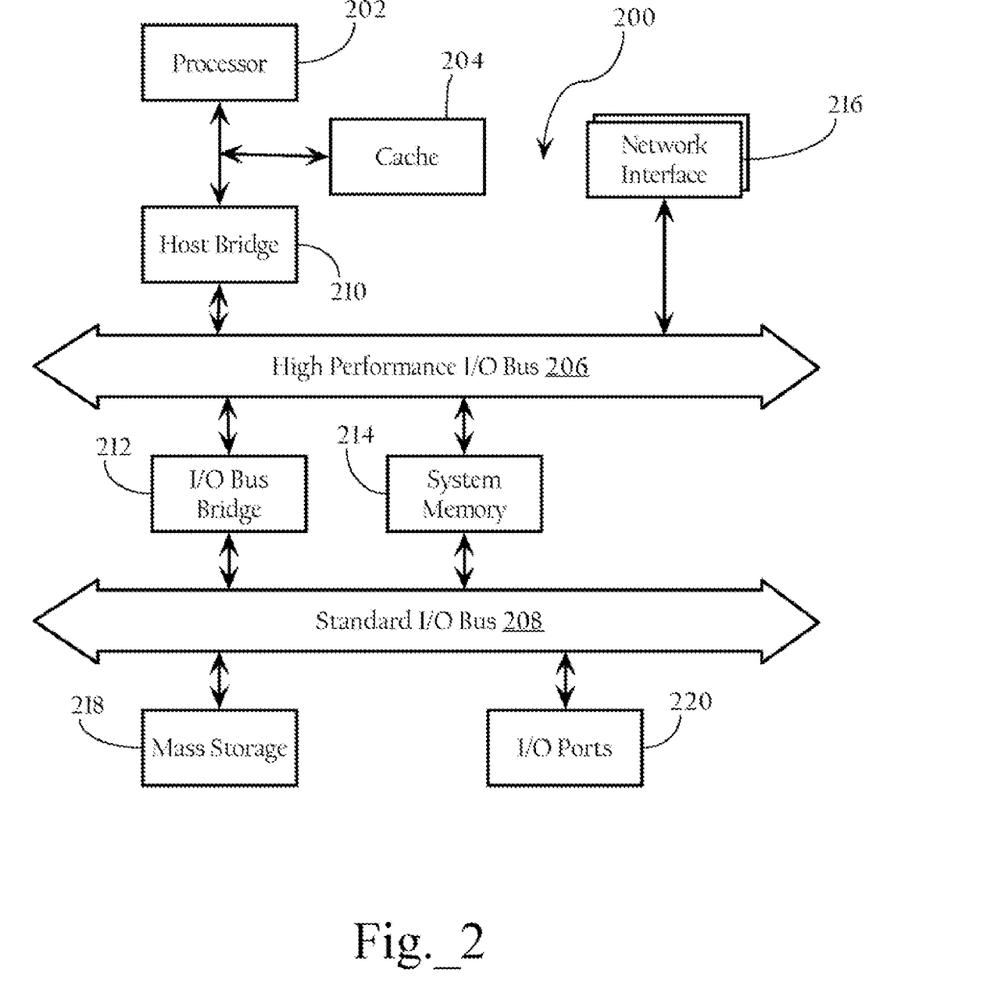
FIG. 2 illustrates an example hardware system, which may be used to implement a gateway.

FIG. 2 illustrates an example hardware system 200, which may be used to implement a gateway 20 or 30. In one implementation, hardware system 200 comprises a processor 202, a cache memory 204, and one or more software applications and drivers directed to the functions described herein. As described in more detail below, the gateway may include a compression module that utilizes a chunking algorithm and aggregation algorithm to compress data blocks of a data stream. In one implementation, hardware system 200 includes a high performance input/output (I/O) bus 206 and a standard I/O bus 208. A host bridge 210 couples processor 202 to high performance I/O bus 206, whereas I/O bus bridge 212 couples the two buses 206 and 208 to each other. A system memory 214 and one or more network/communication interfaces 216 couple to bus 206. Hardware system 200 may further include video memory (not shown) and a display device coupled to the video memory. Mass storage 218 and I/O ports 220 couple to bus 208. In one implementation, caches 22, 32 of gateways 20, 30 may be implemented as a combination of system memory 214 and mass storage 218. A variety of memory management and caching schemes can be used. Hardware system 200 may optionally include a keyboard and pointing device (not shown) coupled to bus 208.

Collectively, these elements are intended to represent a broad category of computer hardware systems, including but not limited to general purpose computer systems based on the Pentium® processor manufactured by Intel Corporation of Santa Clara, Calif., as well as any other suitable processor.

Network interface 216 provides communication between hardware system 200 and any of a wide range of networks, such as an Ethernet (e.g., IEEE 802.3) network, etc. Mass storage 218 provides permanent storage for the data and programming instructions to perform the above described functions implemented in the system controller, whereas system memory 214 (e.g., DRAM) provides temporary storage for the data and programming instructions when executed by processor 202. I/O ports 220 are one or more serial and/or parallel communication ports that provide communication between additional peripheral devices, which may be coupled to hardware system 200.

Hardware system 200 may include a variety of system architectures; and various components of hardware system 200 may be rearranged. For example, cache 204 may be on-chip with processor 202. Alternatively, cache 204 and processor 202 may be packed together as a "processor module," with processor 202 being referred to as the "processor core." Furthermore, certain implementations of the present invention may not require nor include all of the above components. For example, the peripheral devices shown coupled to standard I/O bus 208 may couple to high performance I/O bus 206. In addition, in some implementations only a single bus may exist, with the components of hardware system 200 being coupled to the single bus. Furthermore, hardware system 200 may include additional components, such as additional processors, storage devices, or memories.

As discussed above, in one embodiment, the operations of the gateway described herein are implemented as a series of software routines run by hardware system 200. These software routines comprise a plurality or series of instructions to be executed by a processor in a hardware system, such as processor 202. Initially, the series of instructions are stored on a storage device, such as mass storage 218. However, the series of instructions can be stored on any suitable storage medium, such as a diskette, CD-ROM, ROM, EEPROM, etc. Furthermore, the series of instructions need not be stored locally, and could be received from a remote storage device, such as a server on a network, via network/communication interface 216. The instructions are copied from the storage device, such as mass storage 218, into memory 214 and then accessed and executed by processor 202.

An operating system manages and controls the operation of hardware system 200, including the input and output of data to and from software applications (not shown). The operating system provides an interface between the software applications being executed on the system and the hardware components of the system. According to one embodiment of the present invention, the operating system is the Windows® 95/98/NT/XP operating system, available from Microsoft Corporation of Redmond, Wash. However, the present invention may be used with other suitable operating systems, such as the Apple Macintosh Operating System, available from Apple Computer Inc. of Cupertino, Calif., UNIX operating systems, LINUX operating systems, and the like.

C. Basic Information Flow

Figure 3:
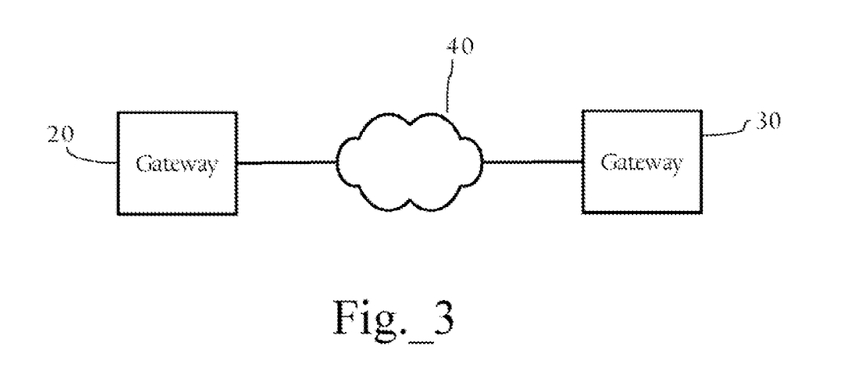
FIG. 3 illustrates an example flow of information from a sending system to a receiving system.

FIG. 3 illustrates an example flow of information between gateways 20 and 30. In one implementation, gateway 20 receives a data stream from one or more hosts 24. For ease of illustration, only one data block 302 is shown to represent a portion of the data stream. Implementations of the present invention described herein may involve multiple contiguous data blocks. As described in more detail below, a chunking algorithm divides the data block 302 into base chunks and computes chunk signatures. The compression module then applies a super chunk rule, to compute one or more aggregation trees comprising super chunks as stem nodes and base chunks as leaf nodes. In one implementation, a base chunk signature is a checksum of the raw data, while super chunk signatures are a function (e.g., hash) of corresponding child chunk nodes. The compression module of gateway 20 compresses the data by looking up the computed aggregation trees in cache 22, replacing raw data with the chunk signatures of the highest level matching nodes. The compression module also stores the aggregation trees and/or base chunks not currently in the cache 22. This improves compression ratios compared to basic DRE schemes without aggregation and thus increases throughput, since a single chunk signature may potentially replace a larger amount of raw data during transmission. Maintaining base chunks and corresponding signatures in a hierarchical aggregation tree, however, also preserves the granularity and performance advantages achieved by smaller chunks.

Gateway 20 then transmits the resulting compressed data block 304, which may include base chunks of raw data (labeled "R") and chunk signatures (labeled "S") across network 40 to gateway 30. In one implementation, a compression module at the gateway 30 reconstructs the data stream by converting the chunk signatures into corresponding raw data. The gateway 30, in one implementation, decompresses the data stream by looking up the detected chunk signatures and replacing the chunk signatures with the corresponding raw data, which results in a data block 306 that matches the data block 302. The following describes the compression process, according to one particular implementation, in more detail.

D. Data Compression

D.1. Chunking Algorithm

Figure 4:
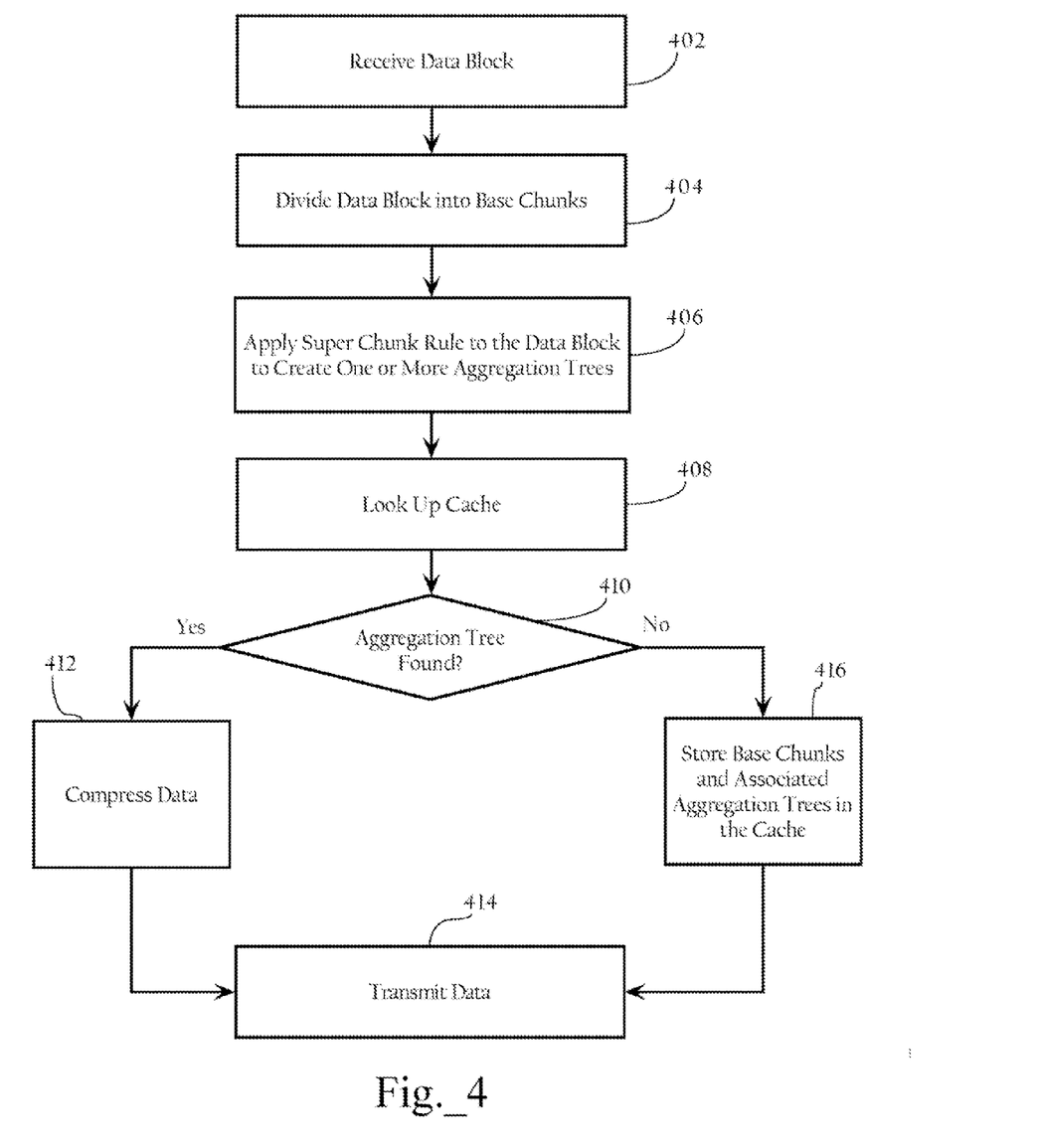
FIG. 4 illustrates an example method for compressing data.
Figure 5A:
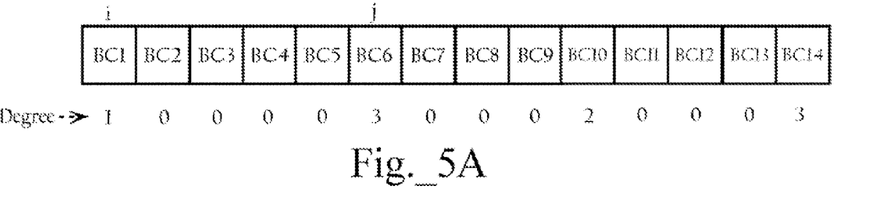
FIG. 5A illustrates an example block diagram of a data block that is divided, into base chunks.

FIG. 4 illustrates an example method for compressing data. As FIG. 4 shows, gateway 20 first receives a data block (402). The compression module of gateway 20 applies a chunking algorithm to divide or chunk the data block into base chunks (404). Any suitable chunking algorithm can be used. For example, fixed or variable sized chunks can be created. FIG. 5A illustrates an example block diagram of a data block that is divided into base chunks BC1-BC14. In one implementation, a given breakpoint may be the last byte of a chunk, after which a next chunk starts. In one implementation, the compression module may apply any arbitrary deterministic chunking algorithm suitable for data redundancy elimination (DRE). In one implementation, a deterministic chunking algorithm may be one that behaves according to some deterministic function that can be replicated.

Any fingerprinting algorithms or any other suitable rolling checksum method may be used to provide a desired breakpoint distribution. In one implementation, the compression module implements a variable size chunking algorithm. In one implementation, the chunking algorithm is a pseudo-random algorithm that uses Rabin polynomials. To select a breakpoint, the chunking algorithm calculates values of a Rabin polynomial for a fixed-size sliding window of N consecutive bytes (e.g., 32 bytes) in the data block until the chunking algorithm gets a value that meets a chunking criterion. In one implementation, the sliding window is such that the starting position of the window is changed from byte position 1 to byte position 2 to byte position 3, and continuing through the input buffer, until the chunking criterion is met. In one implementation, the chunking criterion may be that the last X bits of the computed value of the Rabin polynomial are all equal to 1. In other words, the chunking algorithm shifts the sliding window until the last X bits of the Rabin polynomial are equal to 1. In one implementation, the last byte at the end of the window becomes the breakpoint. This process is repeated for the remainder of the data block or simply restarted for an infinite stream. In one implementation, X may be varied to achieve a desired average chunk size. That is, statistically, a given value of X controls an average chunk size assuming uniformly random data. For example, if X is set to 8 and the data is uniformly random, a breakpoint may be expected at every 256 bytes. Accordingly, the expected average chunk size may be 256 bytes. Still further, if X is set to 9, the expected average chunk size increases by a factor of $2=2^1$ (i.e., from 256 to 512 bytes). That is, the chunking algorithm selects a breakpoint when 9 or more of the last bits of a corresponding Rabin polynomial value are equal to 1. Note, however, that the value of the Rabin polynomial for a given chunk may be X or greater than X.

The number of consecutive 1s, starting with the least significant bit, in the Rabin polynomial for a given chunk can also correspond to a degree value used to aggregate one or more adjacent, consecutive chunks into a super chunk, as discussed more fully below. A breakpoint degree may represent a probabilistic frequency that a given chunk may occur in a random data stream. In one implementation, a breakpoint degree is based on the number of consecutive is in the Rabin polynomial of a chunk. For example, a chunk where the last 9 bits of the Rabin polynomial are all 1 s is less likely to occur than a chunk having a Rabin polynomial where the last 8 bits are all 1 s. Accordingly, a degree value is inversely proportional to its likelihood of occurrence. In one implementation, the number of consecutive 1 bits at the end of the Rabin polynomial can be the degree. In the variable sized chunking algorithm discussed above, the degree value is equal to or greater than X (e.g. 8). In such an implementation, the degree value may be offset by X (e.g., D=number of last consecutive 1 bits minus X). Of course, with fixed-size or other variable-sized chunking algorithms, the degree value for a given chunk may vary more greatly. Furthermore, other methods of computing a degree value can also be used.

Furthermore, other deterministic chunking algorithms can be used. The aggregation algorithm may work in combination with any of the chunking algorithms that observe the following properties. Given an average chunk size S and a block of data, the chunking algorithm will produce a set of breakpoints, B(S). Further, given an integer value d (characterizing an aggregation step, i.e., an average number of children per super chunk node in an aggregation tree) and average chunk size S, $B(S*(d^i))$ is a subset of $B(S*(d^j))$ when $i>=j$. In one implementation, a breakpoint X degree may be then defined as follows. A breakpoint X has a degree i if and only if i is a maximum integer value such that breakpoint X belongs to $B(S*(d^j))$ for all $j<=i$. Note, that for chunking schemes used for DRE, whether using fixed-size division or pseudo-random division (based on sliding window fingerprinting or on winnowing), each breakpoint has a well-defined, finite degree for any feasible choice of chunk size S and aggregation step d. Note that for some algorithms all values of S and d may not be feasible. For example, in one implementation, the chunking algorithm based on Rabin polynomial may require both to be powers of 2.

D.2. Aggregation Algorithm

Figure 5B:
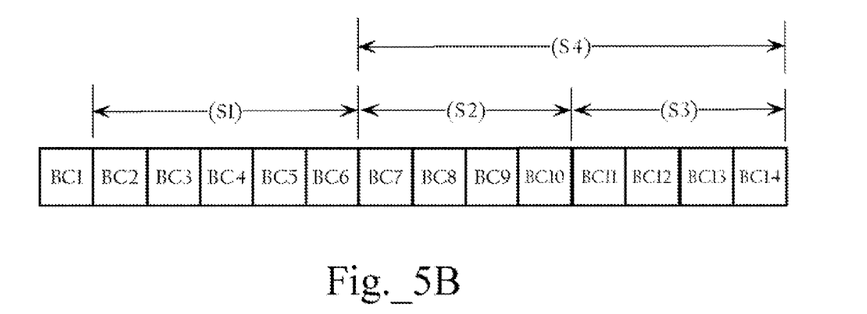
FIG. 5B illustrates an example block diagram of base chunks that are aggregated into super chunks.

Referring again to FIG. 4, the compression module applies a super chunk rule to the base chunks in the data block to create one or more aggregation trees (406). More specifically, in one implementation, the aggregation algorithm groups the adjacent base chunks into one or more super chunks based on a deterministic algorithm. In one implementation, the super chunk rule is as follows. A given series of base chunks following a base chunk i, up to and including as base chunk j, may be aggregated into a super chunk if those base chunks have breakpoint degree values less than the breakpoint degrees of both base chunks i and j (with the exception of chunk j itself). For example, referring again to FIG. 5A, the series of base chunks BC2-BC6 may be aggregated because the base chunks BC2 through BC5 have breakpoint degree values of "0," which is less than the breakpoint degree values of base chunk BC1, which is "1," and also less than that of base chunk BC6, which is "3," In one implementation, the compression module creates super chunks for all contiguous base chunks that satisfy the super chunk rule. Application of the super chunk rule in this manner results in a hierarchical structure called an aggregation tree (see FIGS. 5B and 5C). FIG. 5B illustrates an example block diagram of base chunks that are aggregated into super chunks. At the output is an aggregation tree, which contains all the base chunks as leaf nodes, and super chunks as stem nodes. Each super chunk has its own identifying signature, just like any basic chunk. In one implementation, a super chunk signature is based on a function of the signatures of the stem node's children.

D.3. Aggregation Trees

Figure 5C:
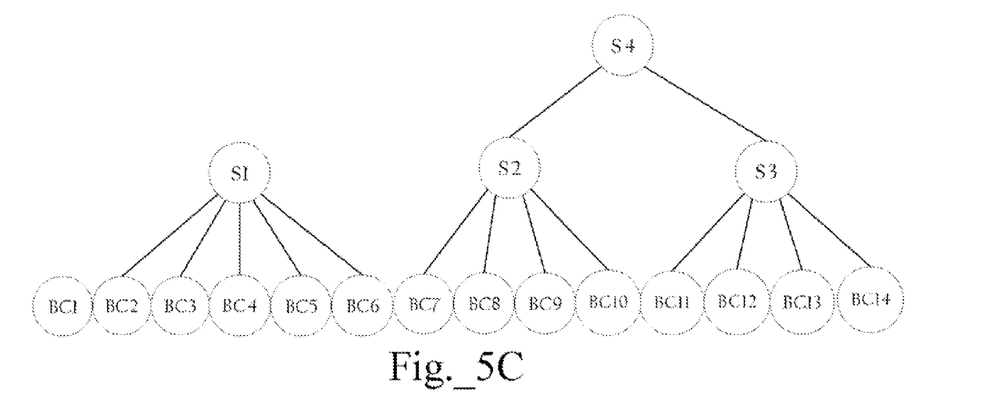
FIG. 5C illustrates an example block diagram of an aggregation tree comprising super chunks and base chunks.

As indicated above, an aggregation tree is a hierarchical structure that includes all of the base chunks as leaf nodes and one or more super chunks as stem nodes. FIG. 5C illustrates an example block diagram of the aggregation trees comprising super chunks (e.g., S1-S4) and base chunks (e.g., BC1-BC14), resulting from application of the super chunk rule to the data block of FIG. 5A. As FIG. 5C shows, the nodes of the aggregation tree correspond to the super chunks and base chunks of FIG. 5B.

In one implementation, each of the super chunks and each of the base chunks may be identified by a chunk signature. In one implementation, a chunk signature can be a checksum or hash of the raw data of a given base chunk. In one implementation, a given chunk signature at a given node may be a function of signatures of the children of that node. As such, it would not be necessary to access actual data every time a chunk signature is calculated, yet allows for collision resistant and data dependent identifiers. In other words, the chunk signature of a node having child nodes may represent all of the chunk signatures and raw data below that node. Accordingly, a chunk signature may be substituted for a base chunk or sequence of base chunks during transmission to reduce the amount of raw data transmitted.

In one implementation, the aggregation algorithm may apply a speculative aggregation. Consider the following example. Suppose the aggregation algorithm encountered new super chunk AB first and then new super chunk CD, where super chunks AB and CD are aggregates of base chunks A and B, and C and D, respectively. If the aggregation algorithm later encounters a super chunk ABCD, the compression module will transmit the chunk signatures corresponding to super chunks AB and CD (e.g., as <sig(AB),sig(CD)>), because the aggregation algorithm never actually saw the super chunk ABCD. This is a likely situation, for example, when the same file is transmitted twice (over FTP, HTTP or any other suitable protocol). The compression module may read the data from network buffers, and the boundary between two consecutive reads is non-deterministic and may change for every file transfer. To optimize such a situation, the compression module may buffer an aggregation tree obtained from a previous data block and combine the buffered aggregation tree with the aggregation tree of a new data block. The compression module may then speculatively aggregate data in both the current data block and the previous data block. While this might not facilitate compression of a current data block, it would facilitate compression of future data blocks if the same data is sent through the system again but is split differently. Note that actual data is not required to be buffered for speculation. Only an associated aggregation tree or a portion of the associated aggregation tree would be needed.

D.4. Cache Lookup

Referring still to FIG. 4, the compression module performs a lookup in cache 22 to identify if any of the aggregation trees are stored in cache 22 (408). In one implementation, the compression module performs a top-down look up in cache 22 to find the highest level matches in the computed aggregation trees against the existing aggregation trees in the cache 22. If a given set of data had already passed through the system, that (redundant) set would be detected, most likely without having to execute a lookup for tree leaves. Thus, the number of lookups could be significantly reduced, as well as the number of signatures representing a given data pattern.

In one implementation, compression module performs a top-down lookup, where the compression module first searches every node in the aggregation tree for the node with the largest grouping of super chunks. For example, the compression module may first search for super chunk S4. If it is found, the compression module stops searching. If super chunk S4 is not found, the compression module may then search for super chunk SC2 and so on until the compression module finds a match, or does not find a match.

Referring still to FIG. 4, if the compression module finds a matching aggregation tree (410), the compression module compresses the data (412) by substituting raw data chunks and/or super chunks with associated chunk signatures and then transmits the data (414).

If the compression module does not find a matching aggregation tree (410), the compression module may conclude that the data is new. Accordingly, the compression module will store the base chunks and associated aggregation trees in the cache 22 for future lookups (516) and then transmits the data (414). If the data is completely new, the number of lookups may be greater than the number of leaves in the aggregation tree. If the number of base chunks in the data is N, in the worst case, the number of lookups is $N*(d/(d-1))$, where d is the aggregation step. For example, in one implementation, if $d>=2$, the number of lookups would be at most $2*N$. In one implementation, where $d=4$, for example, the number of lookups is bounded by $1.3*N$.

Because the super chunk rule proactively creates multiple possible aggregations or super chunks from the same data the compression module can quickly detect redundant data in future incoming data streams. Also, if the data is only slightly changed (or not modified at all), major portions of it may be represented by a relatively small number of signatures. For example, suppose a data block includes chunks ABC. In some traditional DRE approaches, the next time the system receives redundant chunks ABC, the system would transmit a data block <sig(A),sig(B),sig(C)>. However, embodiments described herein would transmit a data block <sig(ABC)>, which would be one third as much data. In another example, where the system receives a pattern ABX, where X is some new data, the system will transmit <sig(AB),X>, as opposed to transmitting <sig(A),sig(B),X>.

In one implementation, aggregation affects the storage size of a lookup structure in the same way it affects lookup complexity. That is, if the DRE requires an indexing of N entries to represent some data, aggregated DRE requires to index (at most) $N*(d/(d-1))$ entries to represent the same data. This seems to be a reasonable tradeoff in order to achieve hotter data compression.

In one implementation, the indexing size may be optimized as follows. Due to storage size limitations, moving certain chunks out of indexing structures or aggregation tree(s) may be unavoidable, whether or not aggregation is applied. Accordingly, the number of cache hits for a given chunk may be used to determine whether to keep or replace the chunk. In one implementation, if some super chunks are encountered more frequently than the others, the aggregation algorithm may remove the parents and children of those super chunks from the indexing structures or aggregation tree(s) to free up some space for new data. This does not actually get rid of an old data, since the old data is still represented by the selected frequent super-chunks.

D.6. Decompression

Figure 6:
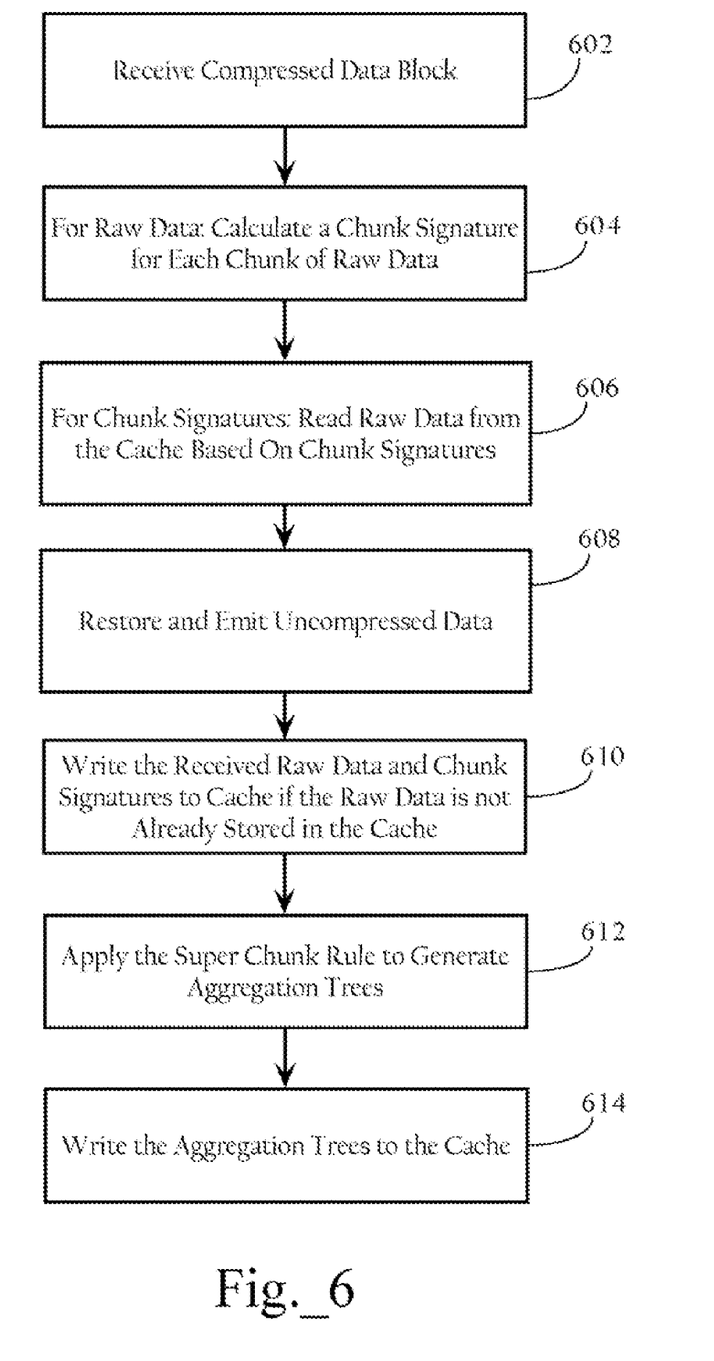
FIG. 6 illustrates an example method for de-compressing data.

FIG. 6 illustrates an example method for decompressing data. As FIG. 6 shows, gateway 30 receives the compressed data block (602). For raw data, the compression module calculates a chunk signature for each chunk of raw data (604). For chunk signatures in the compressed data block, the compression module reads raw data from the cache based on the chunk signatures (606). More specifically, the compression module searches the cache for chunk signatures that match the chunk signatures in the compressed data block, and then reads the raw data corresponding to the matching chunk signatures. The compression module then restores and emits the original raw data uncompressed (608). The compression module then writes the received raw data and chunk signatures to the cache if the raw data is not already in the cache (610). The compression module then applies the super chunk rule to the uncompressed data block to generate aggregation trees (612) and writes the aggregation trees to the cache (614).

The present invention has been explained with reference to specific embodiments. Other embodiments will be evident to those of ordinary skill in the art. It is therefore not intended that the present invention be limited, except as indicated by the appended claims.

What is claimed is:

1. An apparatus comprising:
   a memory operable to store one or more aggregation trees, each aggregation tree comprising one or more base chunk nodes and one or more super chunk nodes, wherein each base chunk node comprises a chunk signature and corresponding raw data, and wherein super chunk nodes correspond to child base chunk nodes and include a chunk signature; and
   logic encoded in one or more tangible media for execution and when executed operable to cause one or more processors to:
   receive a data block;
   divide the data block into a plurality of base chunks, each base chunk having a degree value characterizing the occurrence probability of the base chunk;
   compute chunk signatures for the plurality of base chunks;
   apply a super chunk rule to contiguous sequences of base chunks of the plurality of base chunks to create one or more aggregation trees, wherein the super chunk rule aggregates base chunks based on the respective occurrence probabilities of the base chunks, wherein, to aggregate the base chunks, the logic is further operable to:

identify a contiguous series of base chunks comprising a first base chunk, one or more intermediate base chunks, and a last base chunk;

aggregate, with the last base chunk, one or more intermediate base chunks having a probability value that is higher than the probability value of the first base chunk and than the probability value of the last base chunk;

identify one or more nodes in the one or more created aggregation trees that match corresponding nodes of the aggregation trees in the memory;

compress the received data block based on the identified nodes; and conditionally add the one or more created aggregation trees to the memory.

2. The apparatus of claim 1 wherein the logic is further operable to aggregate the base chunks into one or more super chunks based on a relative position of each base chunk and the occurrence probability value of each base chunk.

3. The apparatus of claim 1 wherein the base chunks are fixed-size chunks.

4. The apparatus of claim 1 wherein the logic is further operable to divide the data block into the plurality of base chunks based on a threshold occurrence probability.

5. The apparatus of claim 1 wherein the logic is further operable to divide the data block into the plurality of base chunks based on a characteristic of values resulting from application of a function to a sliding window of data in the data block.

6. The apparatus of claim 1 wherein the value is a Rabin polynomial, and the characteristic is a contiguous sequence of least significant bits.

7. The apparatus of claim 1 wherein the degree value is inversely proportional to the occurrence probability of a base chunk.

8. A method comprising:

storing in a memory one or more aggregation trees, each aggregation tree comprising one or more base chunk nodes and one or more super chunk nodes, wherein each base chunk node comprises a chunk signature and corresponding raw data, and wherein super chunk nodes correspond to child base chunk nodes and include a chunk signature;

receiving a data block;

dividing the data block into a plurality of base chunks, each base chunk having a degree value characterizing the occurrence probability of the base chunk;

computing chunk signatures for the plurality of base chunks;

applying a super chunk rule to contiguous sequences of base chunks of the plurality of base chunks to create one or more aggregation trees, wherein the super chunk rule aggregates base chunks based on the respective occurrence probabilities of the base chunks, wherein aggregating the base chunks comprises:

identifying a contiguous series of base chunks comprising a first base chunk, one or more intermediate base chunks, and a last base chunk;

aggregating, with the last base chunk, one or more intermediate base chunks having an occurrence probability value that is higher than the occurrence probability value of the first base chunk and than the occurrence probability value of the last base chunk;

identifying one or more nodes in the one or more created aggregation trees that match corresponding nodes of the aggregation trees in the memory;

compressing the received data block based on the identified nodes; and conditionally adding the one or more created aggregation trees to the memory.

9. The method of claim 8 further comprising aggregating the base chunks into one or more super chunks based on a relative position of each base chunk and the occurrence probability value of each base chunk.

10. The method of claim 8 wherein the base chunks are fixed-size chunks.

11. The method of claim 8 wherein the data block is divided into the plurality of base chunks based on a threshold occurrence probability.

12. The method of claim 8 wherein the data block is divided into the plurality of base chunks based on a characteristic of values resulting from application of a function to a sliding window of data in the data block.

13. The method of claim 12 wherein the value is a Rabin polynomial, and the characteristic is a contiguous sequence of least significant bits.

14. The method of claim 8 wherein the degree value is inversely proportional to the occurrence probability of a base chunk.

15. Logic encoded in one or more tangible media for execution and when executed operable to:

access a block of compressed data comprising one or more chunk signatures;

scan a memory comprising one or more aggregation trees, each aggregation tree comprising one or more base chunk nodes and one or more super chunk nodes, wherein each base chunk node comprises a chunk signature and corresponding raw data, and wherein super chunk nodes correspond to child base chunk nodes and include a chunk signature to identify one or more matching chunk signatures;

replace the one or more identified chunk signatures with raw data of corresponding base chunks;

determine occurrence probabilities for the base chunks;

apply a super chunk rule to contiguous sequences of base chunks of the plurality of base chunks to create one or more aggregation trees, wherein the super chunk rule aggregates base chunks based on the respective occurrence probabilities of the base chunks, wherein, to aggregate the base chunks, the logic is further operable to:

identify a contiguous series of base chunks comprising a first base chunk, one or more intermediate base chunks, and a last base chunk;

aggregate, with the last base chunk, one or more intermediate base chunks having a probability value that is higher than the probability value of the first base chunk and than the probability value of the last base chunk; and conditionally add the one or more created aggregation trees to the memory.

16. The logic of claim 15 wherein the base chunks are fixed-size chunks.

17. The logic of claim 15 wherein the base chunks are variable-sized chunks.

18. An apparatus comprising:

means for storing in a memory one or more aggregation trees, each aggregation tree comprising one or more base chunk nodes and one or more super chunk nodes, wherein each base chunk node comprises a chunk signature and corresponding raw data, and wherein super chunk nodes correspond to child base chunk nodes and include a chunk signature;

means for receiving a data block;

means for dividing the data block into a plurality of base chunks, each base chunk having a degree value characterizing the occurrence probability of the base chunk;

means for computing chunk signatures for the plurality of base chunks;

means for applying a super chunk rule to contiguous sequences of base chunks of the plurality of base chunks to create one or more aggregation trees, wherein the super chunk rule aggregates base chunks based on the respective occurrence probabilities of the base chunks, wherein, to aggregate the base chunks, the means for applying the super chunk rule further comprises:

means for identifying a contiguous series of base chunks comprising a first base chunk, one or more intermediate base chunks, and a last base chunk;

means for aggregating, with the last base chunk, one or more intermediate base chunks having an occurrence probability value that is higher than the occurrence probability value of the first base chunk and than the occurrence probability value of the last base chunk;

means for identifying one or more nodes in the one or more created aggregation trees that match corresponding nodes of the aggregation trees in the memory;

means for compressing the received data block based on the identified nodes; and means for conditionally adding the one or more created aggregation trees to the memory.

19. An apparatus comprising:

a memory operable to store one or more aggregation trees, each aggregation tree comprising one or more base chunk nodes and one or more super chunk nodes, wherein each base chunk node comprises a chunk signature and corresponding raw data, and wherein super chunk nodes correspond to child base chunk nodes and include a chunk signature; and logic encoded in one or more tangible media for execution and when executed operable to cause one or more processors to:

receive a compressed data block;

for raw data in the compressed data block, calculate a chunk signature for each chunk of raw data;

for chunk signatures in the compressed data block, read raw data from the cache based on the chunk signatures;

restore and emit the original raw data uncompressed;

write received raw data and chunk signatures to the cache if the raw data is not already in the cache;

apply a super chunk rule to the uncompressed data block to generate aggregation trees, wherein the super chunk rule aggregates chunks based on the respective occurrence probabilities of the chunks, wherein, to aggregate the chunks, the logic is further operable to:

identify a contiguous series of chunks comprising a first chunk, one or more intermediate chunks, and a last chunk; and         aggregate, with the last chunk, one or more intermediate chunks having a probability value that is higher than the probability value of the first base chunk and than the probability value of the last base chunk; and     write the aggregation trees to the cache.

20. An apparatus of claim 19 wherein, to read raw data from the cache, the logic is further operable to:

search the cache for chunk signatures that match chunk signatures in the compressed data block; and read the raw data corresponding to the matching chunk signatures.

\* \* \* \* \*